US006836197B2

(12) United States Patent
Yip et al.

(10) Patent No.: US 6,836,197 B2
(45) Date of Patent: Dec. 28, 2004

(54) DUAL TRACK SAW REFLECTOR FILTER USING WEIGHTED REFLECTIVE GRATINGS

(75) Inventors: Davis S. Yip, La Mirada, CA (US); Edward M. Garber, Los Angeles, CA (US); Alvin M. Kong, Manhattan Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 58 days.

(21) Appl. No.: 10/377,379

(22) Filed: Feb. 28, 2003

(65) Prior Publication Data

US 2004/0169570 A1 Sep. 2, 2004

(51) Int. Cl.[7] .................................................. H03H 9/64
(52) U.S. Cl. ..................... 333/195; 333/196; 310/313 D
(58) Field of Search ................................. 333/193–196; 310/313 B, 313 D

(56) References Cited

U.S. PATENT DOCUMENTS

| | | | | |
|---|---|---|---|---|
| 4,178,571 A | * | 12/1979 | Mitchell | 333/194 |
| 4,281,301 A | | 7/1981 | Stevens et al. | |
| 4,484,160 A | * | 11/1984 | Riha | 333/195 |
| 5,357,228 A | * | 10/1994 | Dufilie | 333/195 |
| 5,365,206 A | | 11/1994 | Machui et al. | 333/195 |
| 5,475,348 A | | 12/1995 | Hode et al. | 333/195 |
| 5,646,584 A | * | 7/1997 | Kondratyev et al. | 333/193 |
| 5,661,444 A | | 8/1997 | Dill et al. | 333/195 |
| 5,831,494 A | | 11/1998 | Solie | 333/193 |
| 5,896,072 A | | 4/1999 | Bergmann et al. | 333/195 |
| 6,104,260 A | * | 8/2000 | Yamada et al. | 333/193 |

FOREIGN PATENT DOCUMENTS

| | | |
|---|---|---|
| DE | 42 113 117 A1 | 10/1993 |
| EP | 0 614 272 A | 9/1994 |
| EP | 1 003 286 A2 | 5/2000 |

OTHER PUBLICATIONS

Solle, L., "Tapered Transducers–Design and Applications", IEEE Ultrasonics Symposium, 1998, pp. 27–37, vol. 1, Oct. 5–8, 1998.

Wright, P.V., Thompson, D.F. and Chang, R.E., "Single–Phase Unidirectional Transducers Employing Uniform–Width Dithered Electrodes", IEEE Ultrasonics Symposium Proc., 1995, pp. 27–32, vol. 1, Nov. 7–10, 1995.

Campbell, C.K., Yanglin, Y. and Sferrazza Papa, J., "Wide–Band Linear Phase SAW Filter Design Using Slanted Transducer Fingers", IEEE Transactions on Sonics and Ultrasonics, vol. SU–29, No. 6, Jul. 1982. pp. 224–228.

Dill, R. et al., A Novel SAW Filter for IF–Filtering in DECT Systems:, Ultrasonics Symposium, 1995 IEEE. Proceedings., 1995 IEEE, Seattle, WA, USA, Nov. 7–10, 1995, New York, NY, USA, IEEE, US, Nov. 7, 1995, pp. 51–54.

Woods, R.C., "Dispersive Delay Lines Using 180 degrees Reflecting Metal Dot Arrays", Ultrasonics Symposium Proceedings, San Diego, CA, USA, vol. 1, Oct. 29, 1982, pp. 88–91, New York, NY.

Riha, G., et al., "RAC–Filters with Position Weighted Metallic Strip Arrays", Proceedings of the Ultrasonics Symposium, San Diego, CA, USA, Oct. 27–19, 1982, vol. 1, Oct. 29, 1982, pp. 83–87.

* cited by examiner

*Primary Examiner*—Barbara Summons
(74) *Attorney, Agent, or Firm*—John A. Miller; Warn, Hoffmann, Miller & LaLone, P.C.

(57) ABSTRACT

A dual track SAW reflector filter (150) including a first track (152) and a second track (154). The first track and the second track (152, 154) include an input transducer (156, 164), an output transducer (158, 166), first reflectors (160, 168) and second reflectors (162, 170). The reflectivity function of the first reflectors (160, 168) and the second reflectors (162, 170) are equal in magnitude and opposite in phase. The input transducers (156, 164) have the same polarity and the output transducers (158, 166) have opposite polarities. Surface acoustic waves produced by the input transducers (156, 164) and received directly by the output transducers (158, 166) are in phase and cancel at the output transducers (158, 166). Surface acoustic waves reflected by the reflectors (160, 162, 168 and 170) are in phase and add at the output transducers (158, 166).

27 Claims, 6 Drawing Sheets

DUAL TRACK SAW REFLECTOR FILTER USING WEIGHTED REFLECTIVE GRATINGS

BACKGROUND OF THE INVENTION

1. Field of the Invention

This invention relates generally to a surface acoustic wave (SAW) reflector filter and, more particularly, to a SAW reflector filter employing dual tracks each including an input transducer, an output transducer and at least one reflector, where the reflectors have reflection functions that are equal in magnitude and opposite in phase so that the reflected waves combine at the output transducers.

2. Discussion of the Related Art

Surface acoustic wave (SAW) filters for use in mobile phone communications systems are designed to be small in size, exhibit good out-of-bandwidth rejection, and provide narrow bandwidths with steep transition edges. Conventional SAW filters include an input transducer and an output transducer formed on a piezoelectric substrate. The input transducer is electrically excited with the electrical input signal that is to be filtered. The input transducer converts the electrical input signal to surface acoustic waves, such as Rayleigh waves, lamb waves, etc., that propagate along the substrate to the output transducer. The output transducer converts the acoustic waves to a filtered electrical signal.

The input and output transducers typically include interdigital electrodes formed on the top surface of the substrate. The shape and spacing of the electrodes determine the center frequency and the band shape of the acoustic waves produced by the input transducer. Generally, the smaller the width of the electrodes, or the number of electrodes per wavelength, the higher the operating frequency. The amplitude of the surface acoustic waves at a particular frequency is determined by the constructive interference of the acoustic waves generated by the transducers.

The combined length of the transducers determines the length of the overall filter. To design a conventional SAW filter with ideal filter characteristics, the filter's impulse response needs to be very long. Because the length of the impulse response is directly proportional to the length of the transducer, the overall length of a conventional SAW filter having ideal characteristics would be too long to be useful in mobile phone communication systems.

Reflective SAW filters have been developed to satisfy this problem. Reflective SAW filters generally have at least one input transducer, one output transducer and one reflector formed on a piezoelectric substrate. The reflector is typically a reflective grating including spaced apart grid lines defining gaps therebetween. The acoustic waves received by the reflector from the input transducer are reflected by the grid lines within the grating so that the reflected waves constructively and destructively interfere with each other and the wave path is folded. The constructively interfered waves are reflected back to the output transducer having a particular phase. Because of the folding, the length of the transducer is no longer dependent on the duration of the impulse response. Reflective SAW filters are, therefore, smaller in size and have high frequency selectivity, and thus are desirable for mobile phone communications systems.

The frequency response of a reflective SAW filter is further improved by weighting the individual reflectors to achieve a desired net reflectivity. The frequency response sets the phase and magnitude of the reflected acoustic waves. Existing weighting methods include position-weighting, omission-weighting and strip-width weighting. Other methods of weighting reflectors include changing the lengths of open-circuited reflective strips within an open-short reflector structure. Weighting the reflector helps to reduce the physical size of the filter and to improve the filter's frequency response.

FIG. 1 is a top plan view of a known dual track SAW reflector filter 10 including a first track 12 and a second track 14. The first track 12 includes a bi-directional input interdigital transducer 16, a bi-directional output interdigital transducer 18, a first reflector 20 positioned on one side of the input transducer 16 and a second reflector 22 positioned on an opposite side of the output transducer 18, all formed on a piezoelectric substrate 24, as shown. Likewise, the second track 14 includes a bi-directional input interdigital transducer 28, a bi-directional output interdigital transducer 30, a first reflector 32 positioned on one side of the input transducer 28 and a second reflector 34 positioned on an opposite side of the output transducer 30, all formed on the piezoelectric substrate 24, as shown. The reflectors 20, 22, 32 and 34 can be any one of a number of suitable reflector devices, such as a reflective grating including a series of grid lines. The interdigital transducers 16, 18, 28 and 30 include a plurality of uniformly spaced interdigital electrode fingers 38 attached at opposite ends by bus bars 40.

An electrical input signal to be filtered is applied to the input transducers 16 and 28 on an input line 42. The input transducers 16 and 28 convert the electric signal into surface acoustic waves that propagate outward from the input transducers 16 and 28 along a top surface of the substrate 24. Some of the acoustic waves from the input transducer 16 are directed towards the reflector 20 and some of the acoustic waves from the input transducer 16 are directed towards the output transducer 18 and the reflector 22. Likewise, some of the acoustic waves from the input transducer 28 are directed towards the reflector 32 and some of the acoustic waves from the input transducer 28 are directed towards the output transducer 30 and the reflector 34.

The reflectors 20, 22, 32 and 34 are tuned to the wavelength $\lambda$ at the center frequency of the frequency band of interest that is to be filtered, and have the same length $L_1$. The reflected waves from the reflectors 20 and 22 are directed back to the output transducer 18 and the reflected waves from the reflectors 32 and 34 are directed back to the output transducer 30 where they are converted to a filtered electrical signal on a common output line 36.

The input transducer 16 and the output transducer 18 are spaced the same distance apart ($L_3$) as the input transducer 28 and the output transducer 30. Also, the output transducers 18 and 30 have opposite polarities. Therefore, the surface acoustic waves directly received by the output transducer 18 from the input transducer 16 are 180° out of phase with the surface acoustic waves directly received by the output transducer 30 from the input transducer 28. Hence, these waves cancel on the output line 36 and will not be converted into electrical signal at the output transducers 18 and 30. These waves pass through the output transducers 18 and 30 with little attenuation and are reflected by the reflector 22 in the track 12 and the reflector 34 in the track 14, respectively.

It is necessary to prevent cancellation of the reflected acoustic waves from the reflectors 20, 22, 32 and 34 on the output line 36. The reflectors 20 and 32 and the reflectors 22 and 34 are thus offset relative to each other by $\lambda/4$. Particularly, the distance between the input transducer 16 and the reflector 20 and the distance between the output transducer 18 and the reflector 22 is $L_2$. However, the distance between the input transducer 28 and the reflector 32 and the distance between the output transducer 30 and the reflector 34 is $L_2+\lambda/4$. Thus, the acoustic waves reflected by the reflectors 20 and 32 travel a different distance to the transducers 18 and 30, respectively, by $\lambda/2$, and are thus 180° out of phase with each other when they reach the output transducers 18 and 30. In other words, the acoustic waves in the second track 14 are delayed relative to the acoustic waves in the first track 12. Therefore, the output signals add on the output line 36. Likewise, the acoustic waves reflected by the reflectors 22 and 34 travel a different distance to the output transducers 18 and 30, respectively, by $\lambda/2$, and thus are out of phase with each other when they reach the output transducers 18 and 30. Therefore, these signals also add on the output line 36. Hence, only reflected acoustic waves are provided on the output line 36.

FIG. 2 is a top plan view of a known SAW filter 50, similar to the filter 10 discussed above, including a first track 52 and a second track 54. In this embodiment, each of the transducers and reflectors are tapered to accommodate a series of contiguous communications channels. Particularly, the first track 52 includes a tapered bi-directional input interdigital transducer 56, a tapered bi-directional interdigital output transducer 58, a first tapered reflector 60 adjacent to the input transducer 56 and a second tapered reflector 62 adjacent to the output transducer 58, all formed on a piezoelectric substrate 64. Likewise, the second track 54 includes a tapered bi-directional input interdigital transducer 68, a tapered bi-directional output interdigital transducer 70, a first tapered reflector 72 adjacent to the input transducer 68 and a second tapered reflector 74 adjacent to the output transducer 70 and opposite to the input transducer 68, all formed on the substrate 64. The reflectors 60, 62, 72 and 74 and the transducers 56, 58, 68 and 70 are tapered, or have varying grating and finger widths, so that the filter 50 becomes a relatively wide fractional bandwidth filter, as is well understood in the art.

The input transducers 56 and 68 are coupled to a common input line 76 and the output transducers 58 and 70 are coupled to a common output line 78. As above, the reflectors 60 and 72 and the reflectors 62 and 74 are offset relative to each other by $\lambda/4$ so that the reflected wave signals are out of phase with each other when they reach the output transducers 58 and 70, and thus add on the output line 78. Also, as above, the direct waves from the input transducer 56 to the output transducer 58 at the first track 52 cancel the direct wave from the input transducer 68 to the output transducer 70 at the second track 54.

FIG. 3 is a top plan view of another known dual track SAW reflector filter 90, and is particularly disclosed in U.S. Pat. No. 5,661,444 issued Aug. 26, 1997 to Dill et al. The SAW filter 90 includes a first track 92 and a second track 94. The first track 92 includes an input single phase unidirectional transducer (SPUDT) 96, an output SPUDT 98 and a reflector 100 positioned between the SPUDTs 96 and 98, all formed on a piezoelectric substrate 102, as shown. Likewise, the second track 94 includes an input SPUDT 106, an output SPUDT 108 and a reflector 110 positioned between the SPUDTs 106 and 108, all formed on the substrate 102, as shown. The input SPUDTs 96 and 106 are electrically coupled to a common input line 112 and the output SPUDTs 98 and 108 are electrically coupled to a common output line 114.

The electrical signal to be filtered is applied to the input line 112 and causes the SPUDT 96 to generate unidirectional surface acoustic waves that propagate along the substrate 102 towards the reflector 100, where they are reflected within the grating structure of the reflector 100 to provide the longer impulse response and phase control. Likewise, the electrical signal on the line 112 applied to the SPUDT 106 generates unidirectional surface acoustic waves that propagate along the piezoelectric substrate 102 towards the reflector 110 to be reflected therein. Reflections within the grating structure of the reflectors 100 and 110 provide signal cancellation and propagation to provide a transmission wave that is phase controlled. The surface acoustic waves that are phase controlled by the reflector 100 are received by the output SPUDT 98 and the surface acoustic waves that are phase controlled by the reflector 110 are received by the output SPUDT 108.

Because the output SPUDTs 98 and 108 have opposite polarities, if the distance between the SPUDT 96 and the SPUDT 98 was the same as the distance between the SPUDT 106 and the SPUDT 108, and the reflectors 100 and 110 were the same length and had the same phase properties, the signals would cancel on the output line 114. To prevent this signal cancellation, the '444 patent proposes making the reflectors 100 and 110 different lengths so that the acoustic waves in the track 94 are delayed relative to the surface acoustic waves in the track 92 so that they add at the output line 114. It is noted that the reflector 100 is centered between the SPUDTs 96 and 98 and the reflector 110 is centered between the SPUDTs 106 and 108.

In this example, the reflector 110 has a length $L_3$ and the reflector 100 has a length $L_3-\lambda/2$. Therefore, the surface acoustic waves from the SPUDT 106 received by the SPUDT 108 are delayed by $\lambda/2$ relative to the surface acoustic waves generated by the SPUDT 96 and received by the SPUDT 98. Because of this delay, the surface acoustic waves received by the SPUDTs 98 and 108 are out of phase with each other when they reach the output SPUDTs 98 and 108, respectively, and thus add on the output line 114.

There are two fundamental problems with the SAW reflector filter 90. First, for optimum performance, the reflector grating reflectivity of the reflectors 100 and 110 can only reflect 50% of the SAW energy from the SPUDTs 96 and 106, and thus only 50% of the useful energy is transmitted from the SPUDTs 96 and 106 through the reflectors 100 and 110 to the output SPUDTs 98 and 108, respectively. The ideal insertion loss of the filter 90 is 6 dB. If other secondary effects, such as propagation loss, resistive loss, diffraction loss, matching circuit loss, etc., are included, the insertion loss of a realistic device will be about 10 dB or more. Secondly, the configuration of the filter 90 provides multiple spurious responses in the time domain after the main signal due to the multiple reflections of the acoustic waves between the SPUDTs 96 and 106 and the reflector gratings 100 and 110. These multiple spurious signals are undesirable because they cause large passband ripples and group delay ripples in the frequency domain. These multiple reflections are most prominent when the insertion loss is matched to the lowest level by the external matching circuits.

FIG. 4 is a top plan view of a known dual track SAW reflector filter 120 of the type disclosed in U.S. Pat. No. 5,896,072 issued Apr. 20, 1999 to Bergman et al. The SAW filter 120 includes a first track 122 and a second track 124. The first track 122 includes a bi-directional input interdigital transducer 126, a reflector 128 positioned on one side of the transducer 126 and an output SPUDT 130 positioned on an opposite side of the transducer 126, all formed on a piezoelectric substrate 132. Likewise, the second track 124 includes a bi-directional input interdigital transducer 134, a reflector 136 positioned on one side of the transducer 134 and an output SPUDT 138 positioned on an opposite side of the transducer 134, all formed on the substrate 132, as shown. The transducers 126 and 134 are coupled to a common input line 140 and the SPUDTs 130 and 138 are coupled to a common output line 142. The transducers 126 and 134 have the same polarity and the SPUDTs 130 and 138 have opposite polarities.

In this embodiment, the input transducer 126 and the output SPUDT 130 are the same distance apart ($L_4$) as the input transducer 134 and the output SPUDT 138. Therefore, the acoustic waves received by the SPUDTs 130 and 138 directly from the input transducers 126 and 134, respectfully, are in phase, and thus cancel on the output line 142 because the SPUDTs 130 and 138 have opposite polarities. However, the distance between the input transducer 126 and the reflector 128 is $L_2$ and the distance between the input transducer 134 and the reflector 136 is $L_2+\lambda/4$. Therefore, the surface acoustic waves reflected by the reflectors 128 and 136 are out of phase with each other when they reach the SPUDTs 130 and 138, respectively, and thus add on the output line 142 because the SPUDTs 130 and 138 have opposite polarities.

There is one fundamental problem with the reflector filter 120 that limits its performance. In order to design a low loss filter using this configuration, the SPUDTs 130 and 138 must be strong. However, strong reflections from the SPUDTs 130 and 138 also results in a strong spurious response in the time domain after the main signal due to the multiple reflections between the SPUDTs 130 and 138 and the reflectors 128 and 136, respectively. This spurious response is undesirable because it causes large passband ripples and group delay ripples in the frequency domain. The spurious response is most prominent when the insertion loss is matched to the lowest level by the external matching circuits.

BRIEF SUMMARY OF THE INVENTION

In accordance with the teachings of the present invention, a dual track SAW reflector filter is disclosed. The filter includes a first track having a first input transducer, a first output transducer, a first reflector and a second reflector. The filter further includes a second track having a second input transducer, a second output transducer, a third reflector and a fourth reflector. The distance between the input transducer and the output transducer in the first track is the same as the distance between the input transducer and the output transducer in the second track. The distance between the first input transducer and the first reflector in the first track, the distance between the first output transducer and the second reflector in the first track, the distance between the second input transducer and the third reflector in the second track and the distance between the second output transducer and the fourth reflector in the second track is the same. Also, the length of all the reflectors is the same. In an alternate embodiment, the first track and the second track may include only one reflector.

The reflectivity function of the first reflector in the first track and the third reflector in the second track are equal in magnitude and opposite in phase. The reflectivity function of the second reflector in the first track and the fourth reflector in the second track are also equal in magnitude and opposite in phase. The input transducers have the same polarity and the output transducers have opposite polarities.

Surface acoustic waves produced by the input transducers and received directly by the output transducers are in phase with each other when they reach the output transducers, and thus cancel on a common output line electrically coupled to both of the output transducers. The acoustic waves then pass through the output transducers with little attenuation and reach the third reflector in the first track and the fourth reflector in the second track. Surface acoustic waves produced by the first input transducer, reflected by the first reflector and received by the first output transducer in the first track are 180° out of phase with surface acoustic waves produced by the second input transducer, reflected by the third reflector and received by the second output transducer in the second track, and thus combine on the common output line. Surface acoustic waves produced by the first input transducer, reflected by the second reflector and received by the first output transducer in the first track are 180° out of phase with surface acoustic waves produced by the second input transducer, reflected by the fourth reflector and received by the second output transducer in the second track, and thus also combine on the common output line.

Additional advantages and features of the present invention will become apparent from the following description and appended claims, taken in conjunction with the accompanying drawings.

DETAILED DESCRIPTION OF THE INVENTION

The following discussion of the embodiments of the invention directed to a dual track SAW reflector filter is merely exemplary in nature, and is in no way intended to limit the invention or its application or uses.

Figure 5:
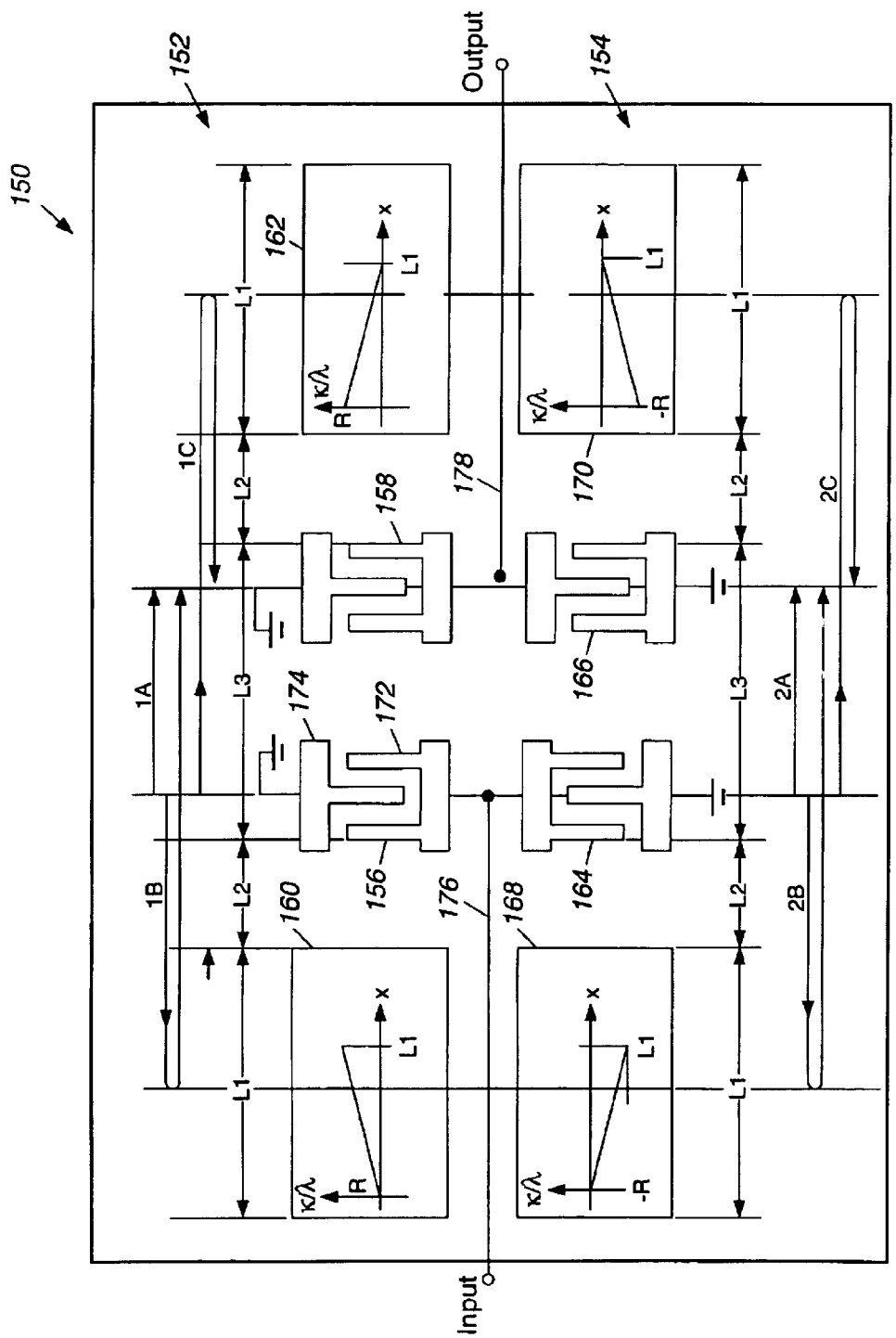
FIG. 5 is a top plan view of a dual track SAW reflector filter, according to an embodiment of the present invention.

FIG. 5 is a top plan view of a dual track SAW reflector filter 150, according to an embodiment of the present invention. The filter 150 includes a first track 152 and a second track 154. The first track 152 includes a bi-directional input interdigital transducer 156 and a bi-directional output interdigital transducer 158. The first track 152 further includes a first reflector 160 positioned on one side of the input transducer 156 and a second reflector 162 positioned on an opposite side of the output transducer 158. Likewise, the second track 154 includes a bi-directional input interdigital transducer 164 and a bi-directional output interdigital transducer 166. The second track 154 further includes a first reflector 168 positioned on one side of the input transducer 164 and a second reflector 170 positioned on an opposite side of the output transducer 166. All of the interdigital transducers 156, 158, 164 and 166 include electrode fingers 172 and opposing end bars 174 as is well known in the art.

According to the invention, the interdigital transducers 156, 158, 164 and 166 can be replaced with any type of transducer suitable for a SAW reflector filter. For example, the transducers 156, 158, 164 and 166 can be single phase uni-directional transducers (SPUDT). In those embodiments that employ SPUDTs one set of the reflectors 160 and 168 or 162 and 170 can be eliminated. Also, in other embodiments that may employ interdigital transducers, only a single reflector in both of the tracks 152 and 154 may be used.

The reflectors 160, 162, 168 and 170 can be any reflector structure suitable for an SAW reflector filter. For example, the reflectors 160, 162, 168 and 170 can be gratings including grid lines, where the grid lines have a predetermined spacing, such as distributed acoustic reflective gratings (DARG) and dithered reflector gratings (DIRG). Suitable reflective gratings are disclosed in U.S. patent application Ser. No. 10/376,802, filed Feb. 28, 2003 and U.S. patent application Ser. No. 10/377,333, filed Feb. 28, 2003, both being filed concurrently herewith, assigned to the assignee of this application and herein incorporated by reference. The reflective gratings discussed in the '802 application employs reflective dots on the grid lines and/or between the grid lines to provide the reflectivity function. The reflective gratings discussed in the '333 application employ grid line dithering to provide the desired reflectivity.

In one embodiment, the reflective grating has a repetitive sampling period each including a predetermined number of grid lines. The sampling period is defined by M grid lines per each N wavelength (N$\lambda$/M), where $\lambda$ is the wavelength of the center frequency of the filter bandwidth, M and N are integers and M>N. Examples of sampling periods include, but are not limited to, $\lambda/4$, $\lambda/3$, $\lambda/5$, $3\lambda/7$, $3\lambda/8$, $4\lambda/7$ and $5\lambda/8$. A characteristic of each sampling period is that uniformly spaced grid lines alone has no net reflectivity for M>N. A similar sampling period scheme can also apply to the input and output transducers.

The reflectors 160, 162, 168 and 170 all have the same length $L_1$. Further, the distance $L_2$ between the reflector 160 and the input transducer 156, the reflector 162 and the output transducer 158, the reflector 168 and the input transducer 164 and the reflector 170 and the output transducer 166 is the same. Also, the distance $L_3$ between the input transducer 156 and the output transducer 158 and the distance between the input transducer 164 and the output transducer 166 is the same.

The input transducers 156 and 164 have the same polarity and are coupled to a common Input line 176. The output transducers 158 and 166 have opposite polarities and are coupled to a common output line 178. Therefore, the acoustic waves produced by the input transducer 156 and received directly by the output transducer 158 are in phase with the surface acoustic waves produced by the input transducer 164 and received directly by the output transducer 166, and thus cancel on the output line 178.

According to the invention, in order to prevent the reflected acoustic waves from canceling in each track at the output transducers 158 and 166, the reflectors 160 and 162 and the reflectors 168 and 170 are mirror images of each other. In addition, the reflectivity functions of the reflector 160 and the reflector 168 are 180° out of phase with each other when observed from any point to the right of the right edge of the reflector 160 or 168 so that signals that reflect will add coherently in the two tracks. However, the magnitude of the reflectivity function of the reflectors 160 and 168 is the same. Likewise, the reflectivity functions of the reflectors 162 and 170 are 180° out of phase with each other when observed from any point to the left of the left edge of the reflector 162 or 170, but have the same magnitude. One skilled in the art would readily recognize how to pattern the grid lines in the reflectors 160, 162, 168 and 178 to provide the mirror images in phase discussed herein. The orientation of the various grid lines, reflective dots, dithered grid lines, etc., within the reflectors 160, 162, 168 and 170 would be properly designed to provide this function.

As will be discussed in detail below, the surface acoustic waves reflected by the reflector 160 are 180° out of phase with the acoustic waves reflected by the reflector 168 when they reach the output transducers 158 and 166, respectively. Likewise, the surface acoustic waves reflected by the reflector 162 are 180° out of phase with the acoustic waves reflected the reflector 170 when they reach the output transducers 158 and 166, respectively. Therefore, only those acoustic waves that provide the desired long impulse response, i.e., those that reflect from a reflector, are converted into filtered electrical signals on the output line 178.

Because the input transducer 156 is bi-directional, surface acoustic waves generated by the transducer 156 propagate in both directions. The surface acoustic waves generated by the input transducer 156 that are directly received by the output transducer 158 propagate on signal path $1_A$. The surface acoustic waves generated by the input transducer 156 that are received by the reflector 160, and are reflected therefrom to be received by the output transducer 158, propagate on signal path $1_B$. The surface acoustic waves generated by the input transducer 156 that are received by the reflector 162, and are reflected therefrom to be received by the output transducer 158, propagate on signal path $1_C$. The same signal paths for the track 154 are shown as $2_A$, $2_B$ and $2_C$.

Because the output transducers 158 and 166 have opposite polarities and the distance between the input transducer 156 and the output transducer 158 and the input transducer 164 and the output transducer 166 is the same, the surface acoustic waves on the signal paths $1_A$ and $2_A$ cancel on the output line 178.

The surface acoustic waves on the signal paths $1_A$ and $2_A$ that propagate through the output transducers 158 and 166 propagate on the signal paths $1_C$ and $2_C$. Because the reflectivity functions of the reflectors 162 and 170 are equal in magnitude and opposite in phase, the reflected acoustic waves on the signal path $1_C$ are 180° out of phase with the reflected acoustic waves on the signal path $2_C$. When the surface acoustic waves on the signal paths $1_C$ and $2_C$ are received by the output transducers 158 and 166, respectively, they will be out of phase with each other, and thus will add on the output line 178 because the output transducers 158 and 166 have opposite polarities.

Because the reflectors 160 and 168 are equal in magnitude and opposite in phase, the reflected acoustic waves on the signal paths $1_B$ and $2_B$ are 180° out of phase with each other. When the acoustic waves on the signal paths $1_B$ and $2_B$ arrive at the input transducers 156 and 164, respectively, the acoustic waves will be out of phase with each other because the input transducers 156 and 164 have the same polarity. Thus, the acoustic waves on the signal paths $1_B$ and $2^B$ will pass through the input transducers 156 and 164 to be received by the output transducers 158 and 166. Because the output transducers 158 and 166 have opposite polarities, the acoustic waves on the signal paths $1_B$ and $2_B$ will combine or add on the output line 178.

Because of the symmetric arrangement of the reflectors 160, 162, 168 and 170 and the transducers 156, 158, 164 and 166, the surface acoustic waves on the signal paths $1_B$ and $1_C$ arrive at the output transducer 158 in phase and simultaneously, and the surface acoustic waves on the signal paths $2_B$ and $2_C$ arrive at the output transducer 166 in phase and simultaneously. Thus, all of the reflected surface acoustic waves on the signal paths $1_B$, $2_B$, $1_C$ and $2_C$ are in phase at the output transducers 158 and 166, and will be converted back to the filtered electrical signal on the output line 178 as a single signal.

Figure 1:
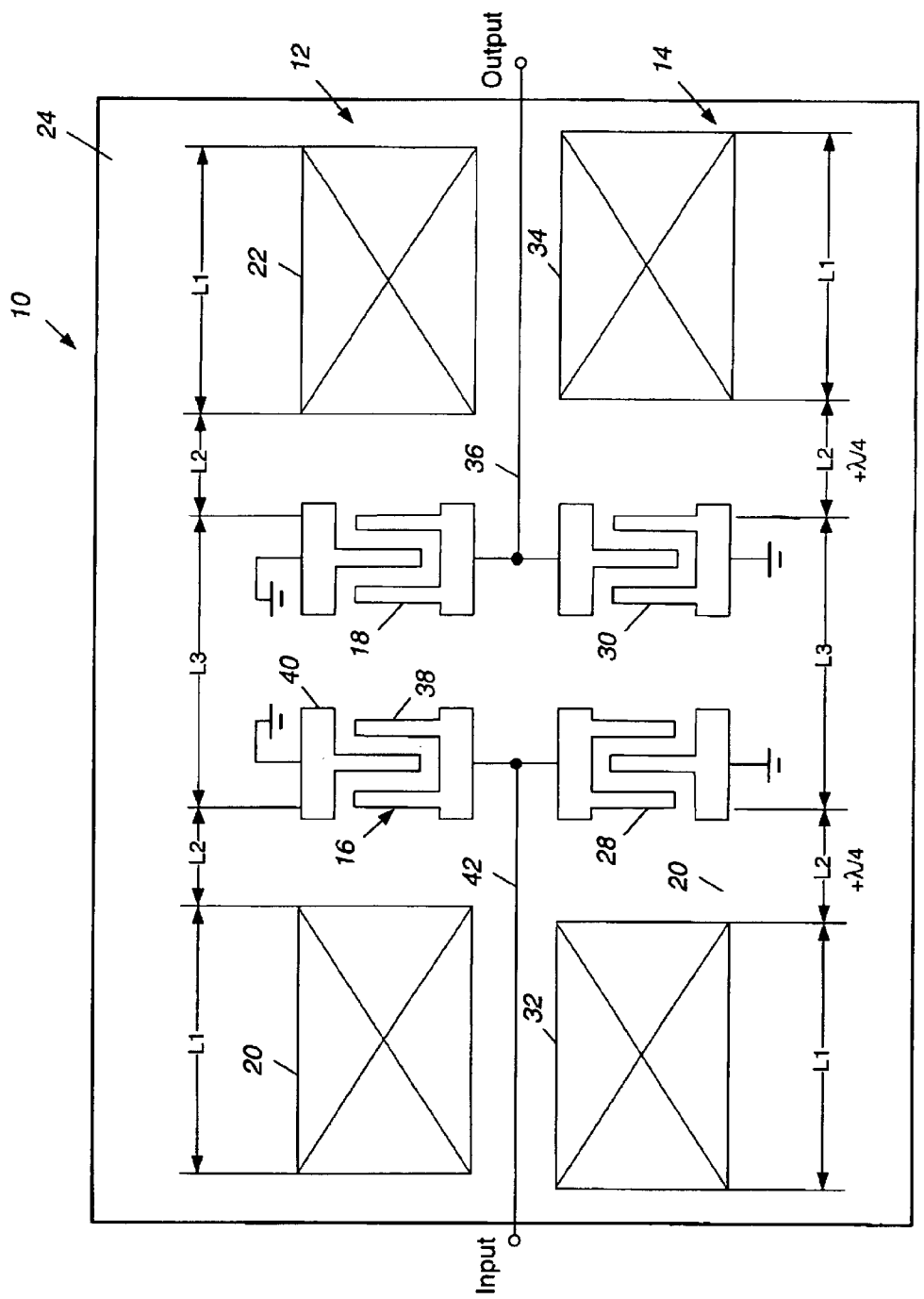
FIG. 1 is a top plan view of a known dual track SAW reflector filter employing reflectors and interdigital transducers.
Figure 2:
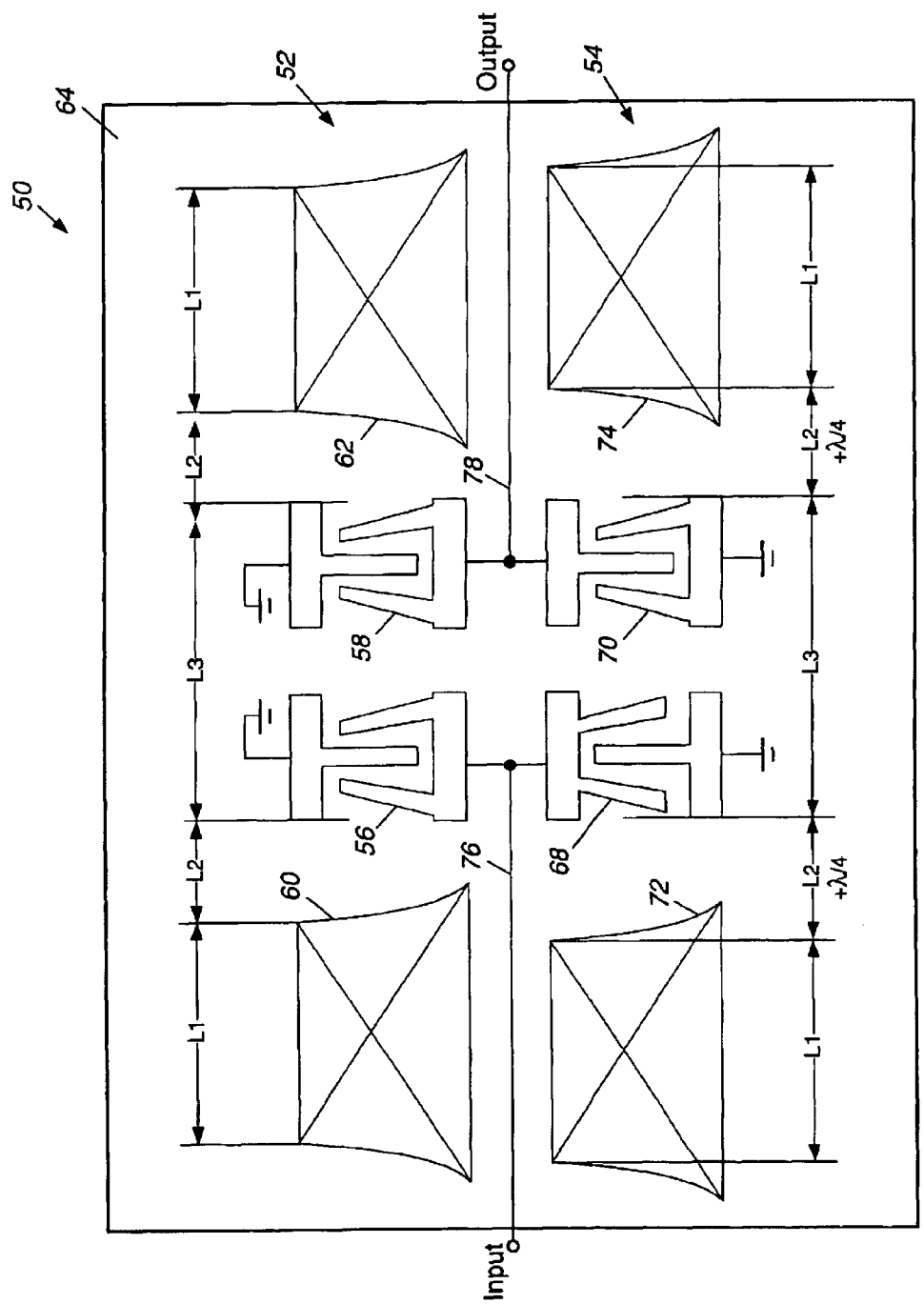
FIG. 2 is a top plan view of a known dual track reflector filter employing tapered reflectors and tapered interdigital transducers.
Figure 3:
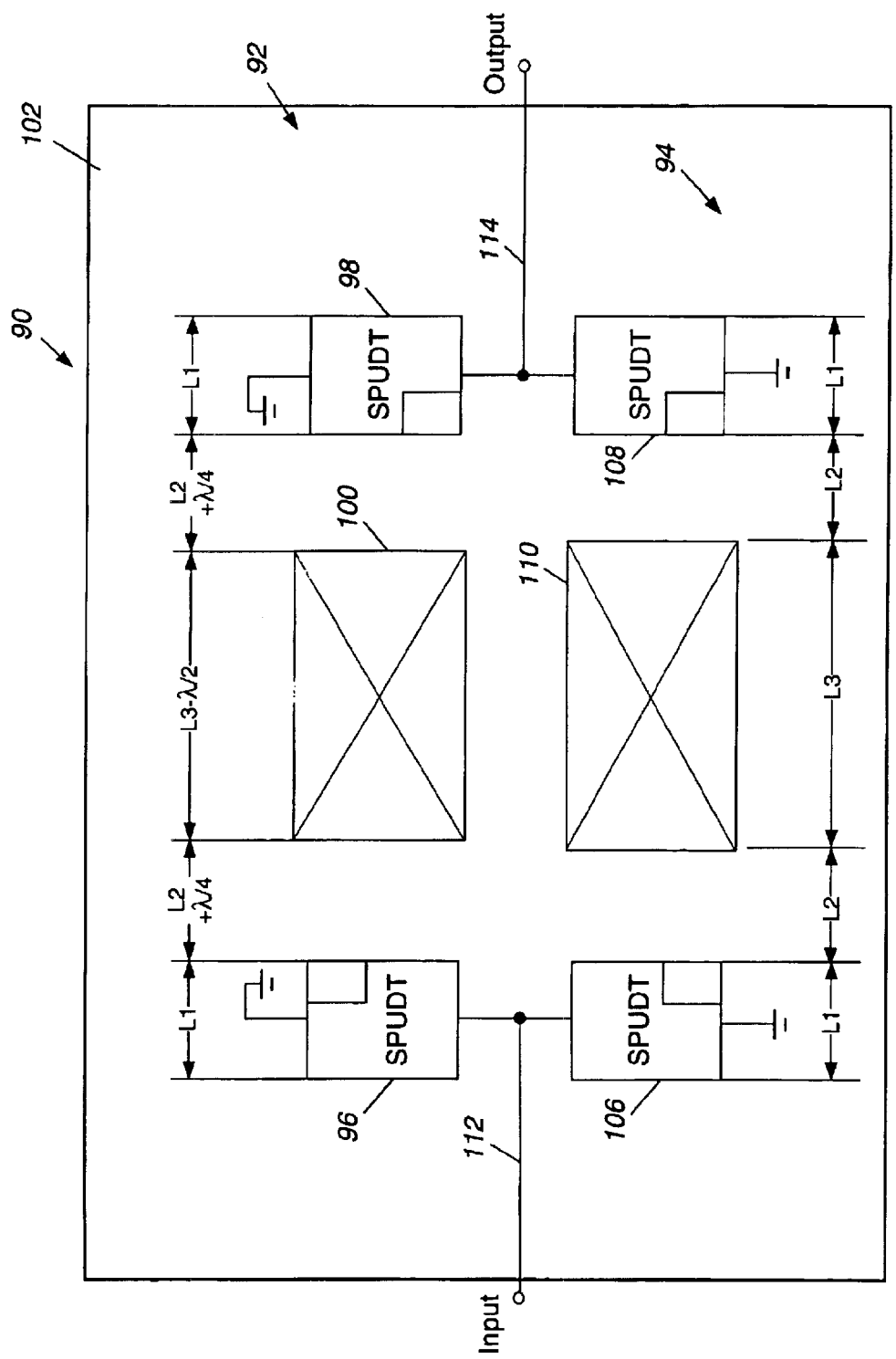
FIG. 3 is a top plan view of a known dual track SAW reflector filter employing single phase uni-directional input and output transducers and reflectors therebetween.
Figure 4:
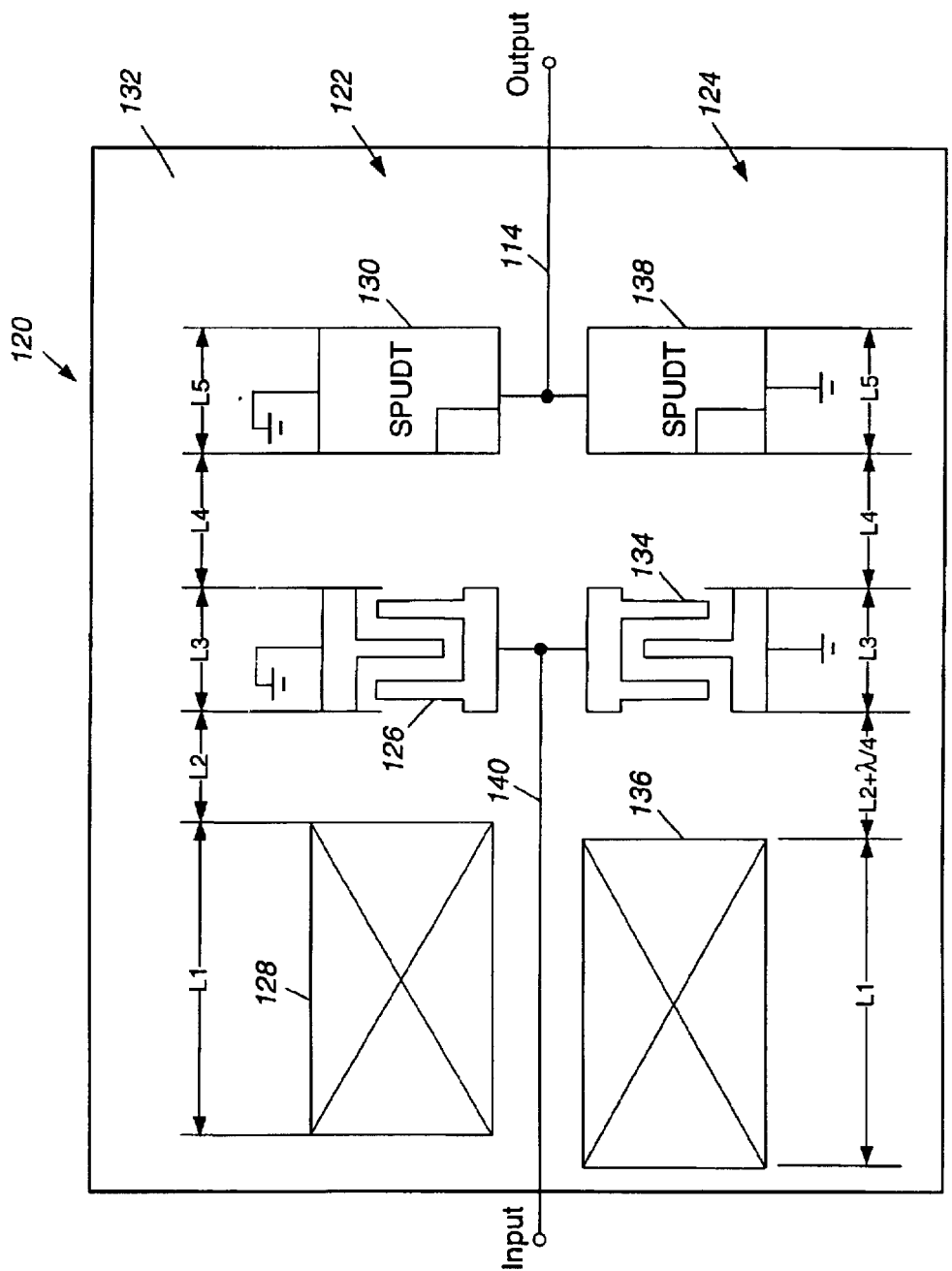
FIG. 4 is a top plan view of a known dual track SAW reflector filter employing reflectors, interdigital input transducers and single phase uni-directional output transducers.
Figure 6:
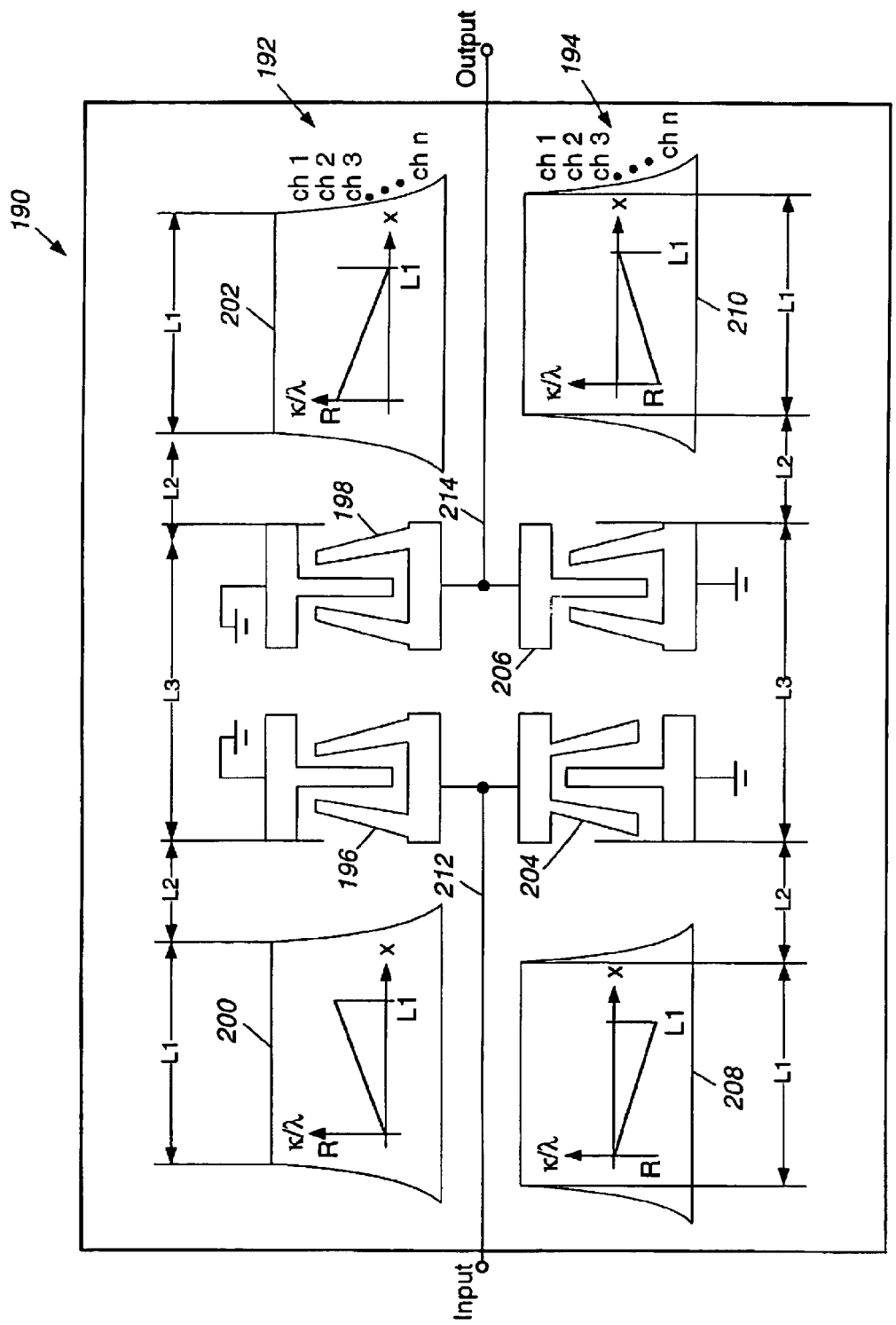
FIG. 6 is a top plan view of a tapered dual track SAW reflector filter, according to an embodiment of the present invention.

FIG. 6 is a top plan view of a dual track tapered SAW reflector filter 190, according to another embodiment of the present invention. In this embodiment, the signal paths of the surface acoustic waves add and subtract in the same manner as the filter 150 discussed above. However, as with the embodiment shown in FIG. 2, each of the various transducers and reflective gratings are tapered to create a filter with a wide fractional bandwidth.

Particularly, the filter 190 includes a first track 192 and a second track 194. The first track 192 includes a tapered bi-directional input interdigital transducer 196 and a tapered bi-directional output interdigital transducer 198 that are both tapered to create a wide fractional bandwidth filter. Further, the first track 192 includes a first tapered reflector 200 and a second tapered reflector 202 that are tapered to create a wide fractional bandwidth filter. Likewise, the second track 194 includes a tapered bi-directional interdigital input transducer 204, a tapered bi-directional interdigital output transducer 206, a first tapered reflector 208 and a second tapered reflector 210. The tapered input transducers 196 and 204 are electrically coupled to a common input line 212 and the output transducers 198 and 206 are electrically coupled to a common output line 214.

The present invention provides a number of advantages not found in the prior art. For example, the SAW reflector filter of the invention provides a wide range of sampling rates for different operating frequencies. A low sampling rate can be used for high frequency applications to improve fabrication yield when the critical dimension is important. A higher sampling rate can be used for lower frequency applications to provide more data samplings when the critical dimension is not important. More samplings per period will improve the accuracy of the gratings' reflectivity function.

Further, a 1.5 GHz operating frequency on ST-Quartz can be achieved using a $3\lambda/5$ or $4\lambda/7$ distributed acoustic reflective grating (DARG) provided that 0.6 $\mu$m is the smallest critical geometry. This is two times higher than any operating frequency ever achieved by a reflective grating device with the same critical geometry dimension on ST-Quartz. The low sampling rate means that the critical sampling dimension is much larger than other sampling rates at a given frequency, thus the large critical dimension can tolerate bigger fabrication error end results and higher fabrication yields.

For those reflectors that are dithered reflective gratings (DIRGs), the DIRG reflectivity is a function of the reflector thickness and the amount of reflector dithering. Having a desirable amount of grating reflection can be achieved by varying the dithering pattern at different periods of the grating, thus providing a near analog implementation of reflectivity throughout the complete reflector.

For those reflectors that are DARGs, the DARG reflectivity is a function of the reflector dot thickness and density. Any desirable amount of grating reflection can be achieved by varying reflective dot densities at different periods of the grating, thus providing near analog implementation of reflectivity throughout the transducer. Increasing the reflectivity strength does not change the critical dimension of the structure, and hence, does not lower the operating frequency or reduce the fabrication yield due to a smaller critical dimension. For those designs that can achieve 1.5 GHz operating frequency on ST-Quartz, only single level metal deposition is required. The single mask fabrication process guarantees a higher fabrication yield than dual mask fabrication processes, especially at high frequency when the critical dimension is small.

The ideally matched response of the SAW reflector filters of the present invention does not provide multiple reflections after the main signal in the time domain. Thus, a low loss reflector filter with small passband ripples and group delay ripples can be provided. Also, a single channel narrow band width reflective filter of the current invention can be modified to design a wide fractional bandwidth.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A dual track surface acoustic wave (SAW) reflective filter for filtering an input signal, said filter comprising:
   a substrate;
   a first track including a first input transducer, a first output transducer and a first reflector formed on the substrate, said first input transducer being responsive to the input signal and generating surface acoustic waves that propagate along the substrate, said first output transducer being responsive to the surface acoustic waves from the first input transducer and generating an electrical output signal; and
   a second track including a second input transducer, a second output transducer and a second reflector formed on the substrate, said second input transducer being responsive to the input signal and generating surface acoustic waves that propagate along the substrate, said second output transducer being responsive to the surface acoustic waves from the second input transducer and generating an electrical output signal, said first reflector and said second reflector having reflection functions that are equal in magnitude and opposite in phase, and wherein a portion of the surface acoustic waves generated by the first input transducer that are reflected by the first reflector and are received by the first output transducer are combined with a portion of the surface acoustic waves generated by the second input transducer that are reflected by the second reflector and are received by the second output transducer.

2. The filter according to claim 1 wherein the first track further includes a third reflector formed on the substrate and the second track further includes a fourth reflector formed on the substrate, said third and fourth reflectors having reflection functions that are equal in magnitude and opposite in phase, and wherein a portion of the surface acoustic waves generated by the first input transducer that are reflected by the third reflector and received by the first output transducer are combined with a portion of the surface acoustic waves generated by the second input transducer that are reflected by the fourth reflector and received by the second output transducer.

3. The filter according to claim 2 wherein the surface acoustic waves generated by the first input transducer and reflected by the first reflector and the third reflector arrive at the first output transducer in phase, and the acoustic waves generated by the second input transducer and reflected by the second reflector and the fourth reflector arrive at the second output transducer in phase.

4. The filter according to claim 2 wherein the distance between the first input transducer and the first reflector, the distance between the first output transducer and the third reflector, the distance between the second input transducer and the second reflector and the distance between the second output transducer and the fourth reflector is the same.

5. The filter according to claim 1 wherein a portion of the surface acoustic waves generated by the first input transducer and directly received by the first output transducer are cancelled by a portion of the surface acoustic waves generated by the second input transducer and directly received by the second output transducer.

6. The filter according to claim 1 wherein the first and second reflectors have the same length.

7. The filter according to claim 1 wherein the first input transducer and the first output transducer are the same distance apart as the second input transducer and the second output transducer.

8. The filter according to claim 1 wherein the first and second reflectors are reflective grating structures including grid lines.

9. The filter according to claim 8 wherein the grid lines are formed by repeated sampling periods defined by M grid lines per N wavelengths of the surface waves (NλM), where λ is the wavelength of the center frequency of a frequency band of interest, M and N are integers and M>N.

10. The filter according to claim 1 wherein the substrate is a piezoelectric substrate.

11. The filter according to claim 1 wherein the first input transducer, the first output transducer, the second input transducer and the second output transducer are selected from the group consisting of interdigital transducers and single phase uni-directional transducers.

12. The filter according to claim 1 wherein the first input transducer, the first output transducer, the first reflector, the second input transducer, the second output transducer, and the second reflector are all tapered to create a wide fractional bandwidth filter.

13. A dual track surface acoustic wave (SAW) reflective filter for filtering an input signal, said filter comprising:
   a piezoelectric substrate;
   a first track including a first input transducer, a first output transducer, a first reflector positioned adjacent the first input transducer and opposite to the output transducer, and a second reflector positioned adjacent to the first output transducer and opposite to the first input transducer all formed on the substrate, said first input transducer being response to the input signal and generating surface acoustic waves that propagate along the substrate, said first output transducer being responsive to the surface acoustic waves from the first input transducer and generating an electrical output signal; and
   a second track including a second input transducer, a second output transducer, a third reflector positioned adjacent to the second input transducer and opposite to the second output transducer and a fourth reflector positioned adjacent to the second output transducer and opposite to the second input transducer all formed on the substrate, said second input transducer being responsive to the input signal and generating surface acoustic waves that propagate along the substrate, said second output transducer being responsive to the surface acoustic waves from the second input transducer and generating an electrical output signal, wherein the reflection functions of the first reflector and the third reflector are equal in magnitude and opposite in phase and the reflection functions of the second reflector and the fourth reflector are equal in magnitude and opposite in phase, and wherein a portion of the surface acoustic waves generated by the first input transducer that are reflected by the first reflector and are received by the first output transducer are combined with a portion of the surface acoustic waves generated by the second input transducer that are reflected by the third reflector and are received by the second output transducer and a portion of the surface acoustic waves generated by the first input transducer that are reflected by the second reflector and are received by the first output transducer are combined with a portion of the surface acoustic waves generated by the second input transducer that are reflected by the fourth reflector and are received by the second output transducer, and wherein a portion of the surface acoustic waves generated by the first input transducer and directly received by the first output transducer are cancelled by a portion of the surface acoustic waves generated by the second input transducer and directly received by the second output transducer.

14. The filter according to claim 13 wherein the first input transducer, the first output transducer, the first reflector, the second reflector, the second input transducer, the second output transducer, the third reflector and the fourth reflector are all tapered to create a wide fractional bandwidth filter.

15. The filter according to claim 13 wherein the first, second, third and fourth reflectors all have the same length.

16. The filter according to claim 13 wherein the first input transducer and the first output transducer are the same distance apart as the second input transducer and the second output transducer.

17. The filter according to claim 13 wherein the distance between the first input transducer and the first reflector, the distance between the first output transducer and the second reflector, the distance between the first input transducer and the third reflector and the distance between the second output transducer and the fourth reflector is the same.

18. The filter according to claim 13 wherein the first, second, third and fourth reflectors are reflective grating structures including grid lines.

19. The filter according to claim 18 wherein the grid lines are formed by repeated sampling periods defined by M grid lines per N wavelengths of the surface waves (NλM), where λ is the wavelength of the center frequency of a frequency band of interest, M and N are integers and M>N.

20. The filter according to claim 13 wherein the first input transducer, the first output transducer, the second input transducer and the second output transducer are selected from the group consisting of interdigital transducers and single phase uni-directional transducers.

21. A surface acoustic wave (SAW) reflective filter for filtering an electrical input signal, said filter comprising:
   a substrate;
   a first track including a first input transducer, a first output transducer and a first reflector formed on the substrate, said first input transducer being responsive to the input signal and generating surface acoustic waves that propagate along the substrate, said first output transducer being responsive to the surface acoustic waves from the first input transducer and generating an electrical output signal, said first input transducer and said first output transducer being positioned on the substrate a predetermined distance apart and said first input transducer and said first reflector being positioned on the substrate a predetermined distance apart; and a second track including a second input transducer, a second output transducer and a second reflector formed on the substrate, said second input transducer being responsive to the input signal and generating surface acoustic waves that propagate along the substrate, said second output transducer being responsive to the surface acoustic waves from the second input transducer and generating an electrical output signal, said second input transducer and said second output transducer being the same distance apart as the first input transducer and the first output transducer, and said second input transducer and said second reflector being the same distance apart as the first input transducer and the first reflector.

22. The filter according to claim 21 wherein the first reflector and the second reflector have the same length.

23. The filter according to claim 21 wherein the first track further includes a third reflector formed on the substrate and the second track further includes a fourth reflector formed on the substrate, wherein the third reflector is the same distance from the first output transducer as the first reflector is from the first input transducer and the fourth reflector is the same distance from the second output transducer as the second reflector is from the second input transducer.

24. A filter according to claim 21 wherein the first reflector and the second reflector have reflection functions that are equal in magnitude and opposite in phase.

25. The filter according to claim 24 wherein the first and second input transducers have the same polarity and the first and second output transducers have opposite polarities.

26. The filter according to claim 25 wherein a portion of the surface acoustic waves generated by the first input transducer that are reflected by the first reflector and are received by the first output transducer are 180° out of phase with a portion of the surface acoustic waves generated by the second input transducer that are reflected by the second reflector and are received by the second output transducer, wherein the electrical signals generated by the first and second output transducers from the surface acoustic waves are added on a common output line coupled to the first and second output transducers.

27. The filter according to claim 26 wherein a portion of the surface acoustic waves generated by the first input transducer and directly received by the first output transducer are in phase with a portion of the surface acoustic waves generated by the second input transducer and directly received by the second output transducer, and wherein the electrical signals generated by the first and second output transducers from the directly received surface acoustic waves are cancelled on the common output line coupled to the first and second output transducers.

* * * * *